US009887079B2

(12) United States Patent
Sugawara et al.

(10) Patent No.: US 9,887,079 B2
(45) Date of Patent: Feb. 6, 2018

(54) SUPPLY APPARATUS AND SUPPLY METHOD FOR SUPPLYING FLUID CARBON DIOXIDE

(71) Applicant: ORGANO CORPORATION, Tokyo (JP)

(72) Inventors: Hiroshi Sugawara, Tokyo (JP); Yoshinori Ono, Tokyo (JP)

(73) Assignee: ORGANO CORPORATION, Tokyo (JP)

( * ) Notice: Subject to any disclaimer, the term of this patent is extended or adjusted under 35 U.S.C. 154(b) by 460 days.

(21) Appl. No.: 14/376,102

(22) PCT Filed: Jan. 29, 2013

(86) PCT No.: PCT/JP2013/051836
§ 371 (c)(1),
(2) Date: Nov. 24, 2014

(87) PCT Pub. No.: WO2013/115156
PCT Pub. Date: Aug. 8, 2013

(65) Prior Publication Data
US 2015/0075636 A1    Mar. 19, 2015

(30) Foreign Application Priority Data

Feb. 2, 2012  (JP) ................................. 2012-020798

(51) Int. Cl.
*H01L 21/02*  (2006.01)
*F17C 7/02*   (2006.01)
(Continued)

(52) U.S. Cl.
CPC ........ *H01L 21/02101* (2013.01); *B01D 5/006* (2013.01); *B08B 7/0021* (2013.01);
(Continued)

(58) Field of Classification Search
CPC .... F25J 1/0027; F25J 2210/80; F25J 2215/80; F25J 2220/80; F25J 2220/82;
(Continued)

(56) References Cited

U.S. PATENT DOCUMENTS

| 8,505,559 B2 * | 8/2013 | Han ................. H01L 21/02071 134/100.1 |
| 2001/0050096 A1 * | 12/2001 | Costantini ................ B01J 3/008 134/58 R |
| 2003/0133864 A1 * | 7/2003 | Billingham ............ B01D 15/00 423/437.1 |

FOREIGN PATENT DOCUMENTS

| JP | 2005-506694 A | 3/2005 |
| JP | 2006-326429 A | 12/2006 |

(Continued)

*Primary Examiner* — Keith Raymond
(74) *Attorney, Agent, or Firm* — Knobbe, Martens Olson & Bear, LLP

(57) ABSTRACT

Provided are a supply apparatus and a supply method for supplying fluid carbon dioxide that are energy-saving and efficient. The supply apparatus for supplying fluid carbon dioxide includes: a circulation system including a purifying unit that removes impurities and contaminants from the carbon dioxide, a storage unit that includes a condenser for changing gaseous carbon dioxide passed through the purifying unit into liquid carbon dioxide, a supply unit that includes a first pump for supplying the liquid carbon dioxide in the storage unit to a use point, and a return line through which excess carbon dioxide supplied from the supply unit but not used at the use point is returned to the storage unit; and a carbon dioxide introduction unit that introduces carbon dioxide, as a starting material or recovered gas, to the circulation system. The carbon dioxide introduction unit includes a second pump for increasing the pressure of the carbon dioxide and the second pump introduces the carbon dioxide to the circulation system.

10 Claims, 2 Drawing Sheets

(51) Int. Cl.
  *F17C 7/04* (2006.01)
  *B08B 7/00* (2006.01)
  *B01D 5/00* (2006.01)
  *C01B 32/50* (2017.01)

(52) U.S. Cl.
  CPC .............. *C01B 32/50* (2017.08); *F17C 7/02* (2013.01); *F17C 7/04* (2013.01); *B01D 2256/22* (2013.01); *B01D 2257/70* (2013.01); *F25J 2220/80* (2013.01); *F25J 2220/82* (2013.01); *F25J 2220/84* (2013.01); *Y02P 20/123* (2015.11); *Y10S 134/902* (2013.01); *Y10T 137/0402* (2015.04); *Y10T 137/794* (2015.04)

(58) Field of Classification Search
  CPC .... F25J 2220/84; B01D 5/006; B01D 5/0072; B01D 5/0096; B01D 53/02; B01D 53/04; B01D 53/0438; B01D 53/0446; B01D 2253/20; B01D 2256/22; B01D 2257/70–2257/80; B08B 7/0021; H01L 21/02101; Y10S 134/902; F17C 7/02; F17C 7/04
  See application file for complete search history.

(56) References Cited

FOREIGN PATENT DOCUMENTS

| | | | |
|---|---|---|---|
| JP | 2006326429 | * | 12/2006 |
| JP | 2012-240876 | A | 12/2012 |
| WO | 2003/033114 | | 4/2003 |
| WO | 2012/157648 | A1 | 11/2012 |

* cited by examiner

US 9,887,079 B2

SUPPLY APPARATUS AND SUPPLY METHOD FOR SUPPLYING FLUID CARBON DIOXIDE

CROSS-REFERENCE TO RELATED APPLICATIONS

This application is the U.S. National Phase under 35. U.S.C. §371 of International Application PCT/JP2013/051836, filed Jan. 29, 2013, which claims priority to Japanese Patent Application No. 2012-020798, filed Feb. 2, 2012. The disclosures of the above-described applications are hereby incorporated by reference in their entirety.

TECHNICAL FIELD

The present invention relates to a supply apparatus and a supply method for supplying high purity fluid carbon dioxide that is usable during a semiconductor device manufacturing process or a liquid crystal display device manufacturing process

BACKGROUND ART

In the manufacturing of a semiconductor device or a liquid crystal display device, the process of treating a member to be treated such as a wafer or a substrate having a microstructure formed on its surface is repeated. Achieving or maintaining high cleanliness in the treated member by removing contaminants stuck to the treated member is important for maintaining the quality of a final product or for improving manufacturing yield.

Recently, upgrading, high integration, and micronization of the treated member have progressed further in the manufacturing process of the semiconductor device and the liquid crystal display device. With this progress, the limitations of conventional wet (wet-type) cleaning treatment such as cleaning or drying by using ultrapure water or chemical solution has begun to be pointed out. To solve this problem, attention is now focused on a treatment device that performs cleaning or drying by using a supercritical fluid having such properties as low viscosity and low surface tension, especially supercritical carbon dioxide. The supercritical fluid, while it is similar in density to liquid, has low viscosity and high diffusibility and exhibits a behavior similar to that of gas. The supercritical fluid, which has properties of a high soaking force and easy contaminant diffusion, is suitable for cleaning the treated member having microstructure formed on its surface. No surface tension occurs in a supercritical state. Thus, in the drying process after cleaning, drying can be performed while preventing a collapse phenomenon caused by the capillary force of the fluid that remains on the treated member surface.

Substances that are employed for such supercritical fluids are carbon dioxide, nitrogen monoxide ($N_2O$), sulfur dioxide ($SO_2$), ethane ($C_2H_6$), propane ($C_3H_8$), chlorofluorocarbon, etc. In specially, the carbon dioxide has the advantages of being noncombustible and harmless and being easily handled because the critical temperature is about 31° C. and the critical pressure is about 7.4 MPa. Supercritical carbon dioxide (may be referred to as supercritical carbon dioxide gas) can be obtained by heating liquid carbon dioxide (may be referred to as liquefied carbon dioxide) that is compressed to a critical pressure or higher. Recently, studies have been conducted on the introduction of a cleaning or drying process using supercritical carbon dioxide in the semiconductor device manufacturing process. This necessitates a stable supplying of high purity carbon dioxide in which impurities and the number of particles (fine particles) have been reduced to the greatest possible degree.

JP 2006-326429 A (hereinafter, referred to as Patent Literature 1) discloses a system for supplying supercritical carbon dioxide while maintaining high cleanliness. In the system described in Patent Literature 1, carbon dioxide is purified through circulation treatment. The system described in Patent Literature 1 includes a circulation system that constantly circulates the purified carbon dioxide, and a supply system that supplies the supercritical carbon dioxide from the circulation system to a user point when necessary. The circulation system includes a condenser for liquefying gaseous carbon dioxide, and an evaporator/separator for gasifying the liquid carbon dioxide.

CITATION LIST

Patent Literature

Patent Literature 1: JP 2006-326429 A

SUMMARY

Technical Problem

When the system described in Patent Literature 1 is industrially implemented, the system or the method for supplying the carbon dioxide is preferably implemented in an energy-saving manner. The inventors of the present application have newly discovered the following problems in the system for supplying carbon dioxide.

Specifically, an evaporator is required to gasify the liquid carbon dioxide, and a condenser is required to liquefy the gaseous carbon dioxide. In other words, energy equivalent to the latent heat of the carbon dioxide must be supplied to the carbon dioxide, or must be captured from the carbon dioxide. Consequently, energy loss occurs in the condenser and/or the evaporator. Particularly, in the system described in Patent Literature 1, the condenser and the evaporator are installed in the circulation system through which the carbon dioxide circulates, and thus energy loss increases during system operation.

It is therefore an object of the present invention to provide a supply apparatus and a supply method for supplying fluid carbon dioxide that are energy-saving and efficient.

Solution to Problem

According to an aspect, the present invention relates to a supply apparatus for supplying liquid carbon dioxide. The supply apparatus includes a circulation system and a carbon dioxide introduction unit that introduces carbon dioxide as a starting material or recovered gas to the circulation system. The circulation system includes a purifying unit that removes impurities and contaminants from the carbon dioxide, a storage unit that includes a condenser for changing gaseous carbon dioxide passed through the purifying unit into liquid carbon dioxide, a supply unit that includes a first pump for supplying the liquid carbon dioxide in the storage unit to a use point, and a return line through which excess carbon dioxide supplied from the supply unit but not used at the use point is returned to the storage unit. The carbon dioxide introduction unit includes a second pump for increasing the pressure of the carbon dioxide and the second pump introduces the carbon dioxide to the circulation system. The pressure of the gaseous carbon dioxide introduced to the storage unit is preferably, for example, equal to or higher than 3 MPa and less than critical pressure.

According to another aspect, the present invention relates to a supply method for supplying fluid carbon dioxide by using a supply apparatus for supplying fluid carbon dioxide. The supply apparatus includes: a circulation system including a purifying unit that removes impurities and contaminants from carbon dioxide, a storage unit that includes a condenser for changing gaseous carbon dioxide passed through the purifying unit into liquid carbon dioxide, a supply unit that includes a first pump for supplying the liquid carbon dioxide in the storage unit to a use point, and a return line through which excess carbon dioxide supplied from the supply unit but not used at the use point is returned to the storage unit; and a carbon dioxide introduction unit that introduces carbon dioxide, as a starting material or recovered gas, to the circulation system and includes a second pump for increasing pressure of the carbon dioxide as the starting material or the recovered gas and the second pump introduces the carbon dioxide to the circulation system. The method includes pressure-feeding the carbon dioxide by the second pump so that pressure of the gaseous carbon dioxide introduced to the storage unit is equal to or higher than 3 MPa and less than critical pressure.

In the supply apparatus, the pressure of the carbon dioxide is increased by the second pump of the carbon dioxide introduction unit, and the carbon dioxide is introduced into the circulation system. Accordingly, the pressure of the carbon dioxide at least in the condenser increases. Latent heat when the gaseous carbon dioxide is changed into the liquid carbon dioxide decreases as the pressure increases. As a result, according to the supply apparatus and the supply method, energy loss in the condenser can be reduced.

In the system described in Patent Literature 1, no consideration is given from the perspective of the energy loss in the condenser. In this case, it is the only requirement is that the carbon dioxide be introduced from a carbon dioxide source (bottle) to the circulation system. Thus, there is no need to install any pump for increasing the pressure of the carbon dioxide in the introduction unit that introduces the carbon dioxide. In fact, Patent Literature 1 fails to disclose such pump.

According to the present invention, a supply apparatus and a supply method for supplying fluid carbon dioxide that are energy-saving and efficient can be provided.

The above and other objects, features and advantages of the present invention will become apparent from the following description with reference to the accompanying drawings which illustrate examples of the present invention.

DESCRIPTION OF EMBODIMENTS

Hereinafter, the preferred embodiments of the present invention will be described with reference to the accompanying drawings.

Figure 1:
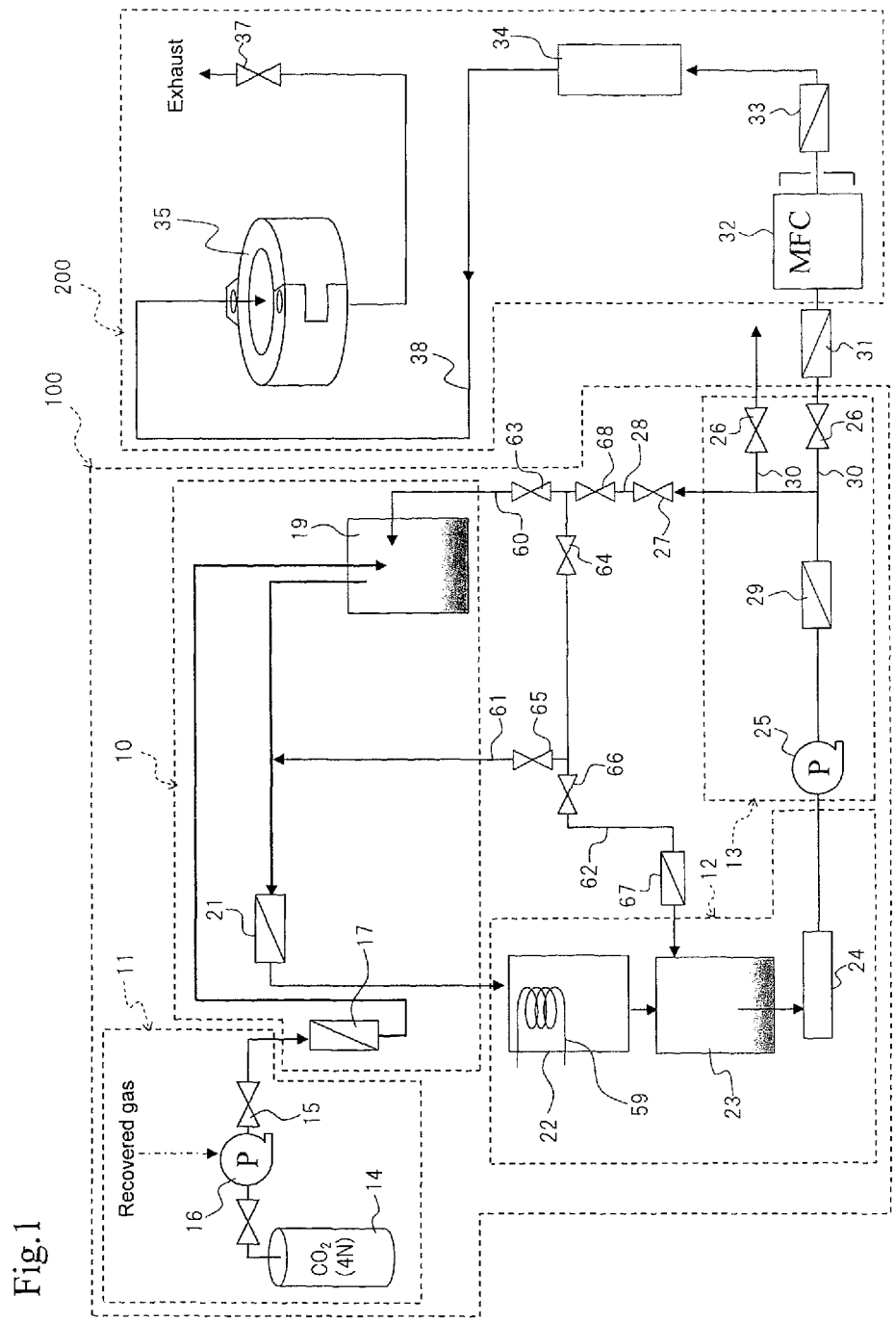
FIG. 1 is a piping flow diagram illustrating a supply apparatus for supplying high purity fluid carbon dioxide according to one embodiment of the present invention.

FIG. 1 is a piping flow diagram illustrating a supply apparatus for supplying high purity fluid carbon dioxide according to one embodiment of the present invention.

Supply apparatus 100 supplies purified fluid carbon dioxide, especially liquid or supercritical carbon dioxide, to use point 200 outside the apparatus.

Supply apparatus 100 includes purifying unit 10 that purifies the carbon dioxide, storage unit 12 that stores the carbon dioxide purified by purifying unit 10 in a liquid state, supply unit 13 that includes pump 25 for supplying the stored liquid carbon dioxide (liquefied carbon dioxide) to use point 200, and carbon dioxide introduction unit 11 that introduces carbon dioxide, as a starting material or gas recovered from use point 200, to storage unit 12 via purifying unit 10.

The respective units of supply apparatus 100 will be described more in detail.

For carbon dioxide introduction unit 11, carbon dioxide tank 14 such as a cold evaporator (CE) or a portable ultralow temperature container (LGC/ELF) is used. Needless to say, gas that is introduced to purifying unit 10 is not limited to the carbon dioxide as the starting material. Carbon dioxide that is used at use point 200 to be recovered as recovered gas can be also introduced.

Carbon dioxide tank 14 and purifying unit 10 are connected each other via on-off valve 15, and the carbon dioxide is introduced to purifying unit 10. Pump 16 for increasing the pressure of the carbon dioxide may be installed in piping for interconnecting carbon dioxide tank 14 and on-off valve 15. The supplying of the carbon dioxide from carbon dioxide tank 14 to purifying unit 10 is stopped when the amount of carbon dioxide stored in storage unit 12 reaches a predetermined value or higher.

Purifying unit 10 may include filter 17 for filtering the introduced carbon dioxide, evaporator 19 for heating the carbon dioxide that passes through filter 17, and filter 21 for filtering gaseous carbon dioxide output from evaporator 19. The gaseous carbon dioxide output from filter 21 is supplied to storage unit 21. However, a bypass and change valve (not illustrated) may be installed to supply the gaseous carbon dioxide output from filter 17 to storage unit 12 without passage through evaporator 19 or filter 21.

Storage unit 12 may include condenser 22 for liquefying the gaseous carbon dioxide supplied from purifying unit 10, storage tank 23 for temporarily storing the carbon dioxide liquefied by condenser 22, and supercooler 24 disposed at the outlet of storage tank 23 to supercool the liquid carbon dioxide (liquefied carbon dioxide).

Supply unit 13 includes pump 25 disposed at the outlet of storage unit 12, in other words, at the outlet of supercooler 24. Pump 25 increases the pressure of the liquefied carbon dioxide. For example, a volume pump such as diaphragm pump or a plunger pump can be used for pump 25. Supply unit 13 further includes on-off valve 26 for boosting the pressure of the liquefied carbon dioxide of storage unit 12 and for supplying the pressure-boosted liquefied carbon dioxide to use point 200 such as a semiconductor process chamber. Excess liquefied carbon dioxide not used at use point 200 is passed through pressure keeping valve 27, and is supplied to purifying unit 10 or storage unit 12 via return line 28 including flow regulating valve 68 for regulating the flow rate of the liquefied carbon dioxide. Filter 29 for physically removing impurities may be installed in a supply path from the outlet of pump 25 to on-off valve 26. This is for the purpose of preventing dust (fine particles) that is generated from the device and the piping of supply unit 12 or from pump 25 from being mixed in the liquefied carbon dioxide that is supplied to use point 200.

In the embodiment, a plurality of pipes 30 for supplying the carbon dioxide to use point 200 branches from a supply path between the outlet of filter 29 and return line 28. ON-off valve 26 is installed in each of branched pipes 30.

The outlet of on-off valve 26 is connectable to use point 200 via filter 31. The use point 200 may be used in various types of place where the highly clean carbon dioxide is received. In the example illustrated in FIG. 1, use point 200 includes mass flow controller (MFC) 32 connected to the outlet of filter 31, filter 33 connected to the outlet of MFC 32, heater 34 that heats the highly clean carbon dioxide supplied via filter 33 to set the temperature and pressure equal to or higher than a critical point, thereby converting the carbon dioxide into supercritical carbon dioxide, chamber (container) 35 which receives the supercritical carbon dioxide and in which the process of cleaning and drying is performed for the wafer, and pressure keeping valve 37 connected to the output of chamber 35 to keep the pressure of the carbon dioxide constant in use point 200. The carbon dioxide used at use point 200 is discharged from the outlet of pressure keeping valve 37.

Needless to say, use point 200 itself is not a component of supply apparatus 100 according to the present invention. In the example, in use point 200, the liquid carbon dioxide is heated to a temperature equal to or higher than the critical temperature to be converted into the supercritical carbon dioxide. However, a heating mechanism may be installed in supply unit 13 of supply apparatus 100, and the liquid carbon dioxide may be heated in supply unit 13 to be converted into the supercritical carbon dioxide.

In FIG. 1, return line 28 includes three branch lines 60, 61, and 62. Branch lines 60, 61, and 62 are partial components of return line 28. Return line 28 includes valves 63, 64, 65, and 66 for selecting branch lines 60, 61, and 62 to which the fluid carbon dioxide will be returned.

The fluid carbon dioxide that passes through first branch line 60 is introduced to evaporator 19 of purifying unit 10. The fluid carbon dioxide that passes through second branch line 61 is introduced to filter 21 of purifying unit 10. In both cases, storage unit 12, supply unit 13, return line 28 and purifying unit 10 (or part thereof) constitute a circulation system for circulating the fluid carbon dioxide.

The fluid carbon dioxide that passes through third branch line 62 is introduced to storage tank 23 of storage unit 12. In this case, storage unit 12 (or part thereof), supply unit 13 and return line 28 constitute a circulation system for circulating the fluid carbon dioxide. Filter 67 may be disposed on third branch line 62. Thus, a part of the excess liquefied carbon dioxide that is not used at use point 200 may be directly returned to storage unit 12.

An example of the basic operation of supply apparatus 100 will be described.

In supply apparatus 100 illustrated in FIG. 1, first, the carbon dioxide is supplied from carbon dioxide tank 14 to purifying unit 10 via on-off valve 15 in the closed state of on-off valve 26 that is connected to use point 200. The carbon dioxide that is supplied to purifying unit 10 passes through filter 17, evaporator 19 and filter 21 in this order. The purified gaseous carbon dioxide is supplied to storage unit 21, and liquefied by condenser 22 to be temporarily stored in storage tank 23. The liquid carbon dioxide (liquefied carbon dioxide) in storage tank 23 is supercooled by supercooler 24. The liquid carbon dioxide is increased to high pressure and is supplied by pump 25, and then passes through filter 29. At least a part of the excess fluid carbon dioxide that is not used at use point 200 is introduced to purifying unit 10 via flow regulating valve 68 on return line 28. Hereinafter, mainly a case where the fluid carbon dioxide passes through first branch line 60 of return line 28 will be described.

The fluid carbon dioxide that is passes through first branch line 60 is supplied to evaporator 19 of purifying unit 10. Evaporator 19 includes a heater, and the gas-liquid interface of the carbon dioxide is formed in evaporator 19. The liquefied carbon dioxide supplied to evaporator 19 is gasified, and thus slightly volatile impurities or particles in the carbon dioxide remain into the liquid phase side. The carbon dioxide that is gasified to be purified in evaporator 19 is supplied in the gas state to filter 21 for removing more particles. Then, the purified gaseous carbon dioxide is cooled by condenser 22 to be liquefied again, and returned as liquefied carbon dioxide to storage tank 23.

As described above, evaporator 19 is preferably a gas-liquid separator for forming the gas-liquid interface of the carbon dioxide therein. In this case, stable and effective purification can be performed compared with an evaporator that evaporates all the carbon dioxide. The gas-liquid separator receives heat from the heater to control a liquid surface. No notable change occurs in temperature or pressure even when the heat is added from the heater, because the carbon dioxide in the gas-liquid separator is in a gas-liquid equilibrium state.

By circulating the carbon dioxide to repeatedly pass through purifying unit 10 in supply apparatus 100, the carbon dioxide in the circulation system can be maintained highly clean.

Immediately after the introduction of the carbon dioxide from carbon dioxide introduction unit 11 into the circulation system, by repeatedly passing the carbon dioxide through purifying unit 10 in the circulation system, impurities such as particles in the carbon dioxide are gradually reduced. Then, after the carbon dioxide has reached a predetermined level of cleanliness, on-off valve 26 may be opened to supply the liquid carbon dioxide (liquefied carbon dioxide) to use point 200. Whether the carbon dioxide has reached the predetermined cleanliness level can be determined by detecting an actual circulation operation period carried out more than or equal to a prescribed period, or by using a sensor for detecting cleanliness.

After the amount of carbon dioxide stored in storage unit 12 has been reduced, on-off valve 26 is closed to stop the supplying of the carbon dioxide to use point 200. Then, the carbon dioxide is supplied from carbon dioxide tank 14 to purifying unit 10 to replenish storage tank 12 with the carbon dioxide. The replenished carbon dioxide is preferably subjected to purification by the circulation operation.

Thereafter, the process of opening on-off valve 26 to supply the carbon dioxide to use point 200 after an amount of carbon dioxide stored in storage unit 12 has reached a predetermined value and after the carbon dioxide has reached the predetermined cleanliness level, and closing on-off valve 26 to replenish supply apparatus 100 with the carbon dioxide after the amount of carbon dioxide stored in storage unit 12 has been reduced is repeated.

As described above, to maintain the purity of the carbon dioxide, the excess carbon dioxide that has not been used at use point 200 is preferably supplied to purifying unit 10. A part of the carbon dioxide may be directly returned to storage unit 12 through third branch line 62 of return line 28. In this case, when an excess carbon dioxide is in a liquid state, it may be directly introduced to storage tank 23. When the excess carbon dioxide is in a gaseous state, it may be introduced to condenser 22.

The liquid carbon dioxide and the gaseous carbon dioxide are mixed in storage unit 12, and the carbon dioxide can be in a gas-liquid equilibrium state. This equilibrium state is determined by the temperature or the pressure of the carbon dioxide (refer to FIG. 2).

Figure 2:
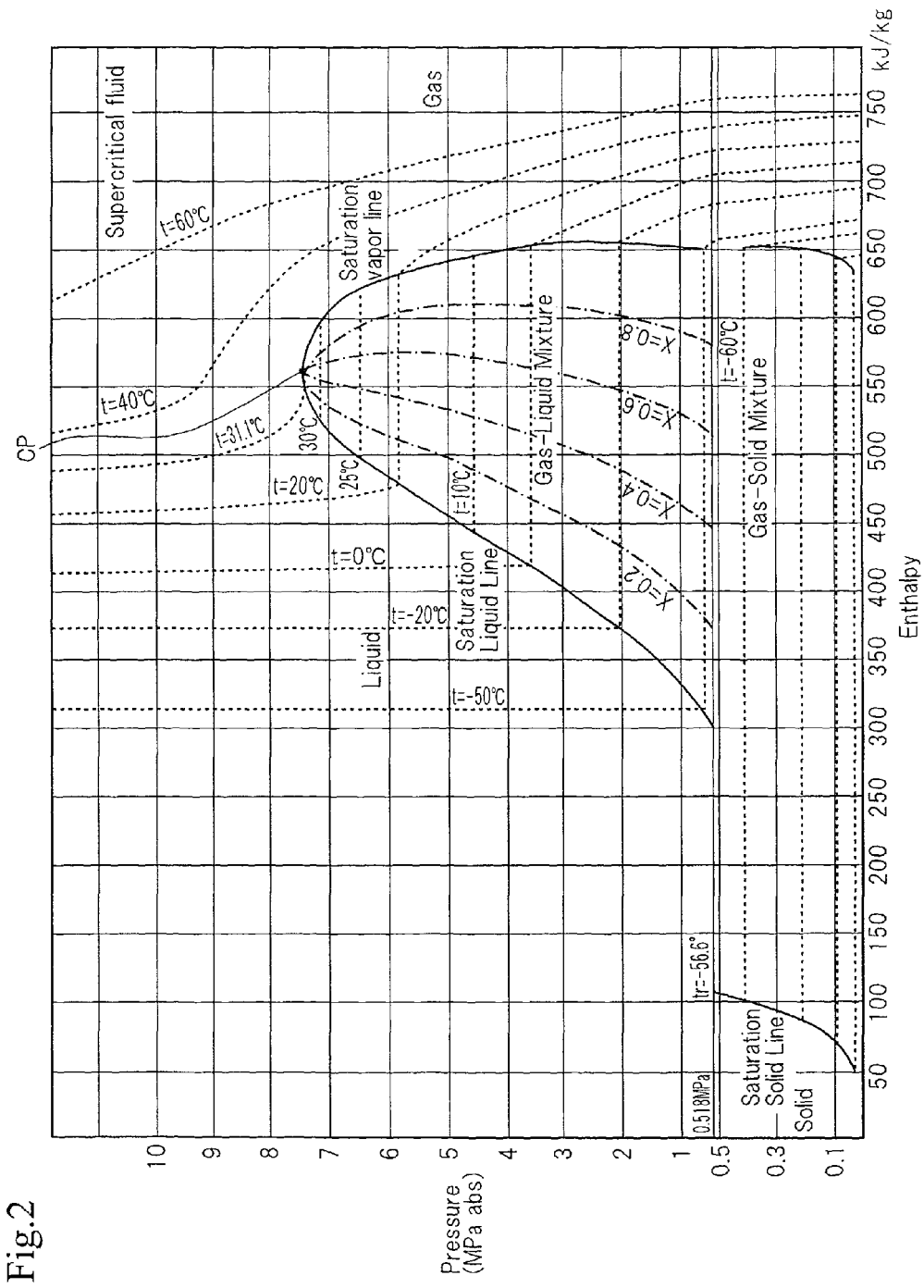
FIG. 2 is an enthalpy diagram of the carbon dioxide.

FIG. 2 is an enthalpy diagram of the carbon dioxide. A vertical axis indicates the pressure of the carbon dioxide, and a horizontal axis indicates enthalpy. A straight line parallel to the vertical axis is an isenthalpic line, and a straight line parallel to the horizontal axis is an iso-pressure line. In FIG. 2, solid lines indicate a saturation liquid line, a saturation vapor line and a saturation solid line. A dotted line indicates an isothermal line.

At given pressure, the temperature of the gas-liquid equilibrium state is uniquely determined. At a given temperature, the pressure of the gas-liquid equilibrium state is uniquely determined.

When the gaseous carbon dioxide is liquefied at a given pressure, energy equivalent to latent heat under the given pressure must be captured from the gaseous carbon dioxide. Thus, condenser 22 must cool the carbon dioxide by the energy that is equivalent to the latent heat. When the liquid carbon dioxide is gasified at a given pressure, energy that is equivalent to latent heat under the given pressure must be applied to the liquid carbon dioxide. Thus, evaporator 19 must heat the carbon dioxide by energy that is equivalent to the latent heat. The latent heat is defined based on the difference between enthalpy on the saturation vapor line and enthalpy on the saturation liquid line at a given pressure (or at a given temperature). For example, the latent heat of the carbon dioxide is about 280 kJ/kg at 2 MPa, and the latent heat of the carbon dioxide is about 220 kJ/kg at 4 MPa. As illustrated in FIG. 2, the latent heat of the carbon dioxide decreases as the pressure increases.

In the system described in Patent Literature 1, no consideration is given from the perspective of the energy loss in the condenser. In this case, the only requirement is that the carbon dioxide be introduced from a carbon dioxide source (bottle) to the circulation system. Thus, there is no need to install any pump to increase the pressure of the carbon dioxide in the introduction unit that introduces the carbon dioxide. In fact, Patent Literature 1 discloses no such pump. To increase the flow rate of the carbon dioxide supplied into the circulation system, a booster pump that does not significantly change the pressure may be installed. When the pressure of the carbon dioxide is low, the pressure resistance of the piping or the container may be low, and thus the thickness of the piping or the container may be low. As a result, the initial cost of the system can be reduced. From this point of view, in the conventional technology, a pump to increase the pressure of the carbon dioxide will be not installed in the carbon dioxide introduction unit that introduces the carbon dioxide into the circulation system.

However, when the carbon dioxide changes between the liquid and the gas states, its latent heat increases as the pressure of the carbon dioxide decreases (refer to FIG. 2). Accordingly, the inventors have discovered the problem of a larger energy loss in condenser 22 and/or evaporator 19 when the lower-pressure carbon dioxide is introduced into the circulation system. In particular, when the carbon dioxide is circulated such that it is repeatedly changed between the liquid state and the gaseous state, there is an increase in energy loss which causes the running cost to increase.

According to the present invention, by installing pump 15 to increase the pressure of the carbon dioxide in carbon dioxide introduction unit 11 and to increase the pressure at condenser 22 and/or evaporator 19, energy loss that accompanies a change in the state of the carbon dioxide can be reduced. Thus, the running cost of supply apparatus 100 can be reduced.

In an industrially used large supply apparatus, a large volume of carbon dioxide is necessary. Accordingly, CE or LGC (ELF) is used for carbon dioxide tank 14 that serves as a supply source. The pressure of the carbon dioxide in the container such as the CE or the LGC (ELF) is normally about 2 MPa. In this case, the temperature of the carbon dioxide in a gas-liquid mixture state is −20° C. Accordingly, condenser 22 needs a cooling mechanism for cooling the carbon dioxide by using a lower-temperature refrigerant. The efficiency of condenser 22 is consequently lowered and a waste of energy is caused.

Thus, pump 16 of carbon dioxide introduction unit 11 preferably pressure-feeds the carbon dioxide so that the pressure of the gaseous carbon dioxide introduced to storage unit 12 can be equal to or higher than 3 MPa and less than the critical pressure of the critical point (refer to code CP illustrated in FIG. 2) of the supercritical state. The energy loss that accompanies the change of state at condenser 22 and/or evaporator 19 can accordingly be reduced. As a result, the supply apparatus and the supply method for supplying the fluid carbon dioxide, that are energy-saving and efficient, can be provided.

More preferably, pump 16 pressure-feeds the carbon dioxide so that the pressure of the gaseous carbon dioxide introduced to storage unit 12 can be equal to or higher than 4 MPa. This enables a further lowering of the latent heat that accompanies a change of the carbon dioxide between the liquid state and the gaseous state. As a result, energy loss can be reduced.

The temperature of the gas-liquid equilibrium state at 4 MPa is about 5° C. (refer to FIG. 2). This provides an advantage in which the cooling efficiency of condenser 22 is higher. In particular, the running cost of supply apparatus 100 can be further reduced because water can be used as a refrigerant for cooling the carbon dioxide. In this case, condenser 22 may include a mechanism for cooling the gaseous carbon dioxide by using cooling water, for example, cooling water piping 59.

Because the volume flow rate of high-pressure carbon dioxide is lower than that of the low-pressure carbon dioxide, the high-pressure carbon dioxide provides an advantage of a lower space velocity or a lower linear velocity on the filter.

The higher pressure of the carbon dioxide necessitates an increase in the pressure resistance of the piping or the container included in the circulation system, thus increasing the initial cost. In view of this, pump 25 of carbon dioxide introduction unit 11 preferably pressure-feeds the carbon dioxide so that the pressure of the gaseous carbon dioxide introduced to storage unit 12 can be equal to or lower than 6 MPa.

This application is based upon and claims the benefit of priority from Japanese patent application No. 2012-20798, filed on Feb. 2, 2012, the disclosure of which is incorporated herein in its entirety by reference.

REFERENCE SIGNS LIST

100 Supply apparatus for supplying fluid carbon oxide
200 Use point
10 Purifying unit
11 Carbon dioxide introduction unit
12 Storage unit
13 Supply unit 14 Carbon dioxide tank
15 On-off valve
16 Pump
17, 21, 29, 31, 33 Filter
19 Evaporator
22 Condenser
23 Storage tank
24 Supercooler
25 Pump
26 On-off valve
27, 37 Pressure keeping valve
28 Return line
59 Cooling water piping
60 First branch line
61 Second branch line
62 Third branch line
63, 64, 65, 66 Valve
68 Flow regulating valve

What is claimed is:

1. A supply apparatus for supplying fluid carbon dioxide comprising:
  a circulation system including:
    a purifying unit removing impurities and contaminants from carbon dioxide;
    storage unit including a condenser for changing gaseous carbon dioxide passed through the purifying unit into liquid carbon dioxide;
    a supply unit including a first pump for supplying the liquid carbon dioxide in the storage unit to a use point through a supply line; and
    a return line through which excess carbon dioxide supplied from the supply unit but not used at the use point is returned to the storage unit or the purifying unit, wherein the return line branches off from the supply line and then splits to return excess carbon dioxide to both the storage unit and the purifying unit, and the return line branches off from the supply line prior to the splitting, and
  a carbon dioxide introduction unit introducing carbon dioxide, as a starting material or recovered gas, to the circulation system,
  wherein the carbon dioxide introduction unit includes a second pump for increasing pressure of the carbon dioxide as the starting material, the pump introducing the carbon dioxide to the purifying unit,
  pressure of the gaseous carbon dioxide introduced to the storage unit is controlled to equal to or higher than 3 MPa and less than critical pressure, and
  the purifying unit includes an evaporator for gasifying the carbon dioxide.

2. The supply apparatus for supplying fluid carbon dioxide according to claim 1, wherein pressure of the gaseous carbon dioxide introduced to the storage unit is controlled to equal to or higher than 4 MPa.

3. The supply apparatus for supplying fluid carbon dioxide according to claim 2, wherein the condenser has a mechanism for cooling the gaseous carbon dioxide by using cooling water.

4. The supply apparatus for supplying fluid carbon dioxide according to claim 1, wherein the purifying unit includes a filter disposed behind the evaporator, the filter filtering gas-phase carbon dioxide.

5. The supply apparatus for supplying fluid carbon dioxide according to claim 1, wherein the evaporator is a gas-liquid separator for forming a gas-liquid interface of the carbon dioxide therein.

6. A supply method for supplying fluid carbon dioxide by using a supply apparatus for supplying fluid carbon dioxide,
  the supply apparatus including:
    a circulation system including:
      a purifying unit removing impurities and contaminants from carbon dioxide;
      a storage unit including a condenser for changing gaseous carbon dioxide passed through the purifying unit into liquid carbon dioxide;
      a supply unit including a first pump for supplying the liquid carbon dioxide in the storage unit to a use point through a supply line; and
      a return line through which excess carbon dioxide supplied from the supply unit but not used at the use point is returned to the storage unit or the purifying unit, wherein the return line branches off from the supply line and then splits to return excess carbon dioxide to both the storage unit and the purifying unit, and the return line branches off from the supply line prior to the splitting, and
    a carbon dioxide introduction unit that introduces carbon dioxide, as a starting material, to the purifying unit, the carbon dioxide introduction unit including a second pump for increasing pressure of the carbon dioxide as the starting material, the second pump introducing the carbon dioxide to the purifying unit,
  the method comprising:
  controlling pressure of the gaseous carbon dioxide introduced to the storage unit to equal to or higher than 3 MPa and less than critical pressure,
  wherein the purifying unit includes an evaporator for gasifying the carbon dioxide.

7. The supply method for supplying fluid carbon dioxide according to claim 6, wherein the pressure of the gaseous carbon dioxide introduced to the storage unit is controlled to equal to or higher than 4 MPa.

8. The supply method for supplying fluid carbon dioxide according to claim 7, wherein in the condenser, the gaseous carbon dioxide is cooled by using cooling water to be changed into liquid carbon dioxide.

9. The supply method for supplying fluid carbon dioxide according to claim 6, wherein the carbon dioxide is gasified by the purifying unit.

10. The supply method for supplying fluid carbon dioxide according to claim 9, wherein the carbon dioxide gasified by the purifying unit is filtered before the gaseous carbon dioxide is introduced to the condenser.

* * * * *